United States Patent

Shue

(10) Patent No.: US 6,436,825 B1
(45) Date of Patent: Aug. 20, 2002

(54) METHOD OF COPPER BARRIER LAYER FORMATION

(75) Inventor: Shau-Lin Shue, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/541,481

(22) Filed: Apr. 3, 2000

(51) Int. Cl.[7] .................................. H01L 21/44
(52) U.S. Cl. .......................... 438/687; 438/653
(58) Field of Search ........................ 438/687, 637, 438/638, 639, 640, 653, 672, 674, 675; 257/751, 752

(56) References Cited

U.S. PATENT DOCUMENTS

| | | | |
|---|---|---|---|
| 5,066,615 A | 11/1991 | Brady et al. | 437/229 |
| 5,614,437 A | 3/1997 | Choudhury | 437/140 |
| 5,712,193 A | 1/1998 | Hower et al. | 437/187 |
| 5,770,520 A * | 6/1998 | Zhao et al. | 438/653 |
| 5,801,098 A | 9/1998 | Fiordalice et al. | 438/653 |
| 5,893,752 A * | 4/1999 | Zhang et al. | 438/687 |
| 5,913,144 A | 6/1999 | Nguyen et al. | 438/643 |
| 5,913,147 A | 6/1999 | Dubin et al. | 438/687 |
| 6,017,818 A * | 1/2000 | Lu | 438/653 |
| 6,130,161 A * | 10/2000 | Ashley et al. | 438/687 |

* cited by examiner

Primary Examiner—David Nelms
Assistant Examiner—Dung A Le
(74) Attorney, Agent, or Firm—George O. Saile; Stephen B. Ackerman

(57) ABSTRACT

A process in the fabrication of integrated circuits has been developed for copper diffusion barrier layer. This invention teaches a method of barrier formation by the deposition by physical vapor deposition (PVD) sputtering (reactive sputtering for nitride compounds) or chemical vapor deposition (CVD) of a copper metal diffusion barrier layer, which consists of the following materials: TaN, Ta, TiN, or WN. Next in the process, is the plasma silation and silicon doping of the barrier layer material followed by high temperature thermal annealing. Scanning electron microscope (SEM) analysis of the silated barrier materials show amorphous films with clusters of silicide material with low silicon concentration and high film density (>99%). Low diffusion properties (amorphous films lack grains for fast grain boundary diffusion) and good chemical vapor deposited (CVD) copper seed layer adhesion, are found with the both TiSiN and TaSiN barrier layers made by this method. The current invention applies to lining both a single and dual damascene structure to form copper metal barrier layers and adhesive copper seed layer for interconnects and vias prior to electrochemical deposition (ECD) of copper.

30 Claims, 2 Drawing Sheets

| Barrier Metal | Anti-diffusion Temp | Structure |
|---|---|---|
| Ti | 450 | Polycrystalline |
| TiN | 600 | Polycrystalline |
| TiSiN | 600 | Amorphous ← 40 |
| Ta | 500 | Polycrystalline |
| TaN | 700 | Polycrystalline |
| TaSiN | 900 | Amorphous ← 42 |

METHOD OF COPPER BARRIER LAYER FORMATION

RELATED PATENT APPLICATION

This application is related to patent aplication Ser. No. 09/501,966, filing date Feb. 10, 2000, assigned to the same assignee as current aplication.

BACKGROUND OF THE INVENTION (1) Field of the invention

This invention relates to a robust method of fabrication used for semiconductor integrated circuit devices, and more specifically to the formation of an improved copper metal diffusion barrier layer that improves copper seed layer adhesion, in a single and dual damascene process, to fabricate reliable metal interconnects and contact vias.

(2) Description of Related Art

Related patents and relevant literature now follow as Prior Art.

U.S. Pat. No. 5,066,615 (Brady et al.) teaches a sputtering method to form TaSiN and other anti-reflection material layers. An antireflection coating for use in integrated circuit processing consists of a film of x-silicon-nitride, where x is a metal from the group consisting of titanium, vanadium, chromium, zirconium, niobium, molybdenum, hafnium, tantalum and tungsten. These coatings are preferably made by sputtering, with the x silicon nitride coating being made by sputtering in a nitrogen-containing atmosphere.

U.S. Pat. No. 5,913,147 (Dubin et al.) describes diffusion barriers from the group Ta, TaN, W, WN, TiW, TiN, TaSiN, TiSiN, WSiN. A method for fabricating copper-aluminum metallization utilizing the technique of electroless copper deposition is described. The method provides a self-encapsulated copper-aluminum metallization structure.

U.S. Pat. No. 5,614,437 (Choudhury) describes a method for manufacturing an ohmic contact on a semiconductor device and includes as a first step, etching a via through a non-conductive layer formed over a partially fabricated version of the semiconductor device. This step exposes a region of a device element such as a source, gate electrode, etc. Next, an ohmic contact layer including tantalum and silicon is deposited over the partially fabricated device and in the vias by sputtering in an argon atmosphere. Thereafter, and in the same processing apparatus, a barrier layer including a tantalum silicon nitride, TaSiN, is deposited over the ohmic contact layer. Then an aluminum alloy metallization layer is directly deposited on the partially fabricated device at a temperature of at least 650 C. At this deposition temperature, the metallization layer conformally fills the via, thereby producing a stable, uniform contact.

U.S. Pat. No. 5,893,752 (Zhang et al.) mentions TaN barrier layers and tantalum oxy-nitride barrier layers. A semiconductor device is described. The first conductive film is over the substrate and a second conductive film is over the first conductive film. The first conductive film includes a refractory metal and nitrogen. The first conductive film has a first portion that lies closer to the substrate and a second portion that lies further from the substrate. The nitrogen percentage for the second portion is lower than the nitrogen atomic percentage for the first portion. The second conductive film includes mostly copper. The combination of portions within the first conductive film provides a good diffusion barrier (first portion) and has good adhesion (second portion) with the second conductive film.

U.S. Pat. No. 5,913,144 (Nguyen et al.) teaches an oxygen containing plasma treatment of a TiN, TiON, TiSiN, TaSiN, TaN, TiW, TiWN, Mo, and WN and other barrier layers. The method claims improvement of adhesion of copper to the diffusion barrier material, such as TIN, in an integrated circuit substrate. The diffusion barrier is exposed to either a reactive oxygen species, or a plasma containing oxygen. A thin layer of the diffusion barrier is oxidized, typically less than 50 Å, in response to exposure to the oxygen environment. CVD copper is then deposited over the oxidized diffusion barrier surface. The oxide layer improves bonding between the copper and diffusion barrier surfaces. The oxide layer permits the control of tolerances in the diffusion barrier preparation processes, and copper precursor, to be relaxed. An integrated circuit comprising an oxide layer between the diffusion barrier and the copper layer is also provided.

U.S. Pat. No. 5,712,193 (Hower et al.) describes a method of treating the surface of a metal nitride barrier layer on an integrated circuit to reduce the movement of silicon through the barrier. The metal nitride barrier (such as TiN) is exposed to a nitrogen plasma, thereby improving the barrier properties of the metal nitride barrier.

U.S. Pat. No. 5,801,098 (Fiordalice et al.) describes a TiN layer exposed to a nitrogen plasma treatment. Furthermore, a method of decreasing resistivity in an electrically conductive layer is described using a high density plasma sputtering technique to deposit the electrically conductive layer over a substrate and exposing the electrically conductive layer to an anneal in an ambient comprised of a plasma.

SUMMARY OF THE INVENTION

It is a general object of the present invention to provide an improved robust method of forming a copper metal diffusion barrier layer, in a single and dual damascene process, to fabricate reliable metal interconnects and contact vias.

For completeness provided by the present invention, is a semiconductor substrate with an insulating layer thereon. A copper metal interconnect typically is patterned within an insulating layer. In addition, a layer of interlevel dielectric (ILD) is deposited and patterned into a trench structure or "gap" opening. Provided can be both a single and dual damascene structure. The insulating material is typically silicon oxide compounds.

The first embodiment of the present invention is the deposition by physical vapor deposition (PVD) sputtering (reactive sputtering for nitride compounds) or chemical vapor deposition (CVD) of a copper metal diffusion barrier layer, which consists of the following materials: TaN, Ta, TiN, or WN.

Next in the process is the one of the main embodiments of the current invention, the silane treatment process of said barrier layer. Silicon doping by a silane gas plasma treatment or "silane soaking" is performed upon the surface of the barrier layer and the silane soaking is performed under the following conditions: plasma power from about 300 to 600 W, plasma time from about 5 to 240 sec. The silicon doping occurs first at the surface of the barrier, raising the surface concentration of silicon to high levels.

In yet another main embodiment of the current invention, is formation of regions of silated TaSi, or TaSiN, or TiSiN, or WSiN, silicon doped compounds, by the aforementioned plasma treatment or silane soaking. In addition, a heat treatment thermal annealing process is applied which drives in the silicides into barrier layer. Exact thermal annealing conditions to convert barrier metal compounds into robust amorphous diffusion barriers are summarized below. It was found that the silated silicon doped compounds exhibit better adhesion properties when combined with chemical vapor deposition (CVD) of copper seed layer. Also, silated silicon doped compound exhibit better resistance to fluorine ion attack, F-, in subsequent processing. As the first example, silated TiN barrier material, TiSiN, forms good diffusion barrier material when annealed at 600° C. and has an amorphous structure. In a similar technique, silated TaN barrier material, TaSiN, forms a good diffusion barrier material when annealed at 900° C. and has amorphous structure. Amorphous barrier layers prohibit the rapid grain boundary diffusion mechanism since crystal grains and associated grain boundaries are not present. Scanning electron microscope (SEM) analysis of the silated barrier layers reveal highly dense films (>99%) and regions of silicides with low silicon content.

In another embodiment of the present invention, the chemical vapor deposition (CVD) of the copper seed layer is performed upon the silated barrier layer. The chemical vapor deposited (CVD) copper seed layer exhibits improved adhesion upon the rigid high density diffusion barrier layer and the silated barrier region. In a subsequent process step, an electrochemical deposition (ECD) of copper is used to fill the trench cavity, upon the copper seed layer.

The next processing step in the building of a single or dual damascene structure is the deposition of copper upon the seed layer, by electrochemical copper deposition (ECD). The kinetics of the electrochemical copper deposition process are based on a uniform, defect-free seed layer and barrier layer with good adhesion properties. The underlying layers improve and make wider the process window for the chemical vapor deposition (CVD) of copper to fill both single and dual damascene structures.

The final processing step in building of the single and dual damascene structure is the chemical mechanical polishing (CMP) back of the excess electrochemical deposited copper metal. The copper is chem-mech polished back without dishing. The copper is polished back so that only the copper that lies in the openings is left to form single and dual inlaid structures that include via and interconnect portions. Device applications include MOSFET and CMOS devices.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

This invention relates to an improved robust method of forming a copper metal diffusion barrier layer, in a single and dual damascene process, to fabricate reliable metal interconnects and contact vias.

Figure 1:
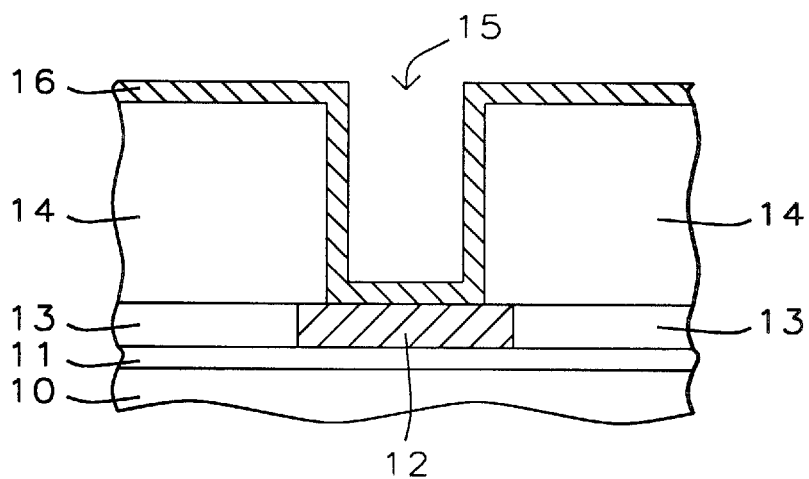
FIG. 1, which in cross-sectional representation illustrates a trench structure filled with the copper metal barrier layer, starting point for the barrier process.

Referring to FIG. 1 illustrated in cross-sectional drawing, for completeness provided, is a semiconductor substrate 10 with an insulating layer 11. A copper metal interconnect 12 is patterned within an insulating layer 13. In addition, a layer of dielectric 14 is deposited and patterned into a trench 15 (gap) opening in FIG. 1. Provided is a single damascene structure 15 and/or a dual damascene structure (not shown in Figs.). The typical insulator material is silicon oxide type compounds.

Referring again in more detail to FIG. 1, which is a cross-sectional representation shows the first embodiment of the present invention, the deposition by physical vapor deposition (PVD) sputtering (reactive sputtering for nitride compounds) or chemical vapor deposition (CVD) of a copper metal diffusion barrier layer 16 selected from the group consisting of TaN, Ta, TiN, or WN.

For completeness, a brief outline of the sputter deposition conditions, physical vapor deposition (PVD), for the barrier layer is as follows: no underlying adhesion layer, Ar and $N_2$ for reactive sputtering of nitride compounds, pressures from about 0.01 to 100 mTorr, DC Magnetron sputtering power from about 1,000 to 2,500 Watts, and AC bias power from about 200 to 500 Watts.

Figure 2:
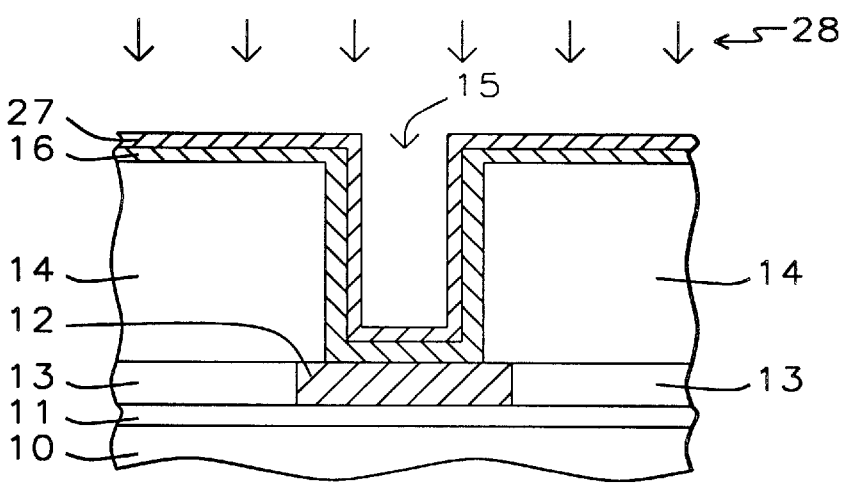
FIG. 2, which in cross-sectional representation illustrates one of the preferred emodiments of the present invention, the silane treatment, silicon doping, of the barrier layer.

Referring to FIG. 2 illustrated in cross-sectional drawing is one of the main embodiments of the current invention, the silans treatment process of said barrier layer 16. Silicon doping (27) is performed upon the surface of the barrier layer by a silane $SiH_4$ plasma treatment (28), plasma power from about 300 to 600 Watts, RF of 13.56 MHz, plasma time from about 5 to 240 sac, temperature from about 150 to 450° C. With the silicon doping (27) layer, the surface concentration of silicon is high.

Figure 3:
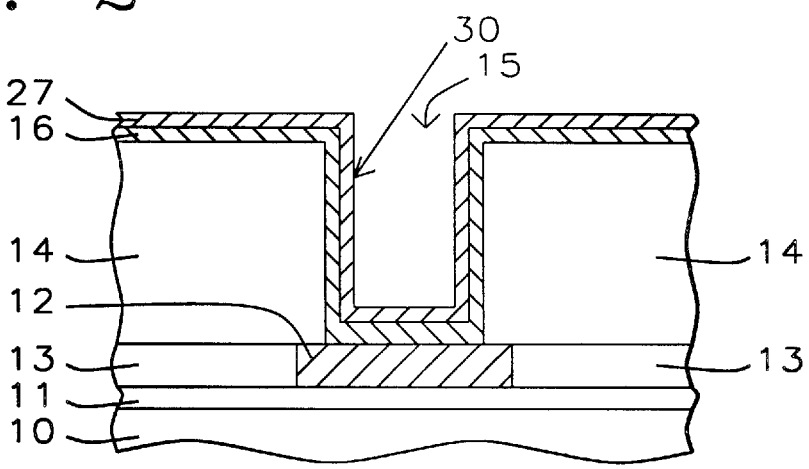
FIG. 3, which in cross-sectional representation illustrates another one of the preferred embodiments of the present invention, annealing of the silane treated barrier layer, forming a rigid diffusion barrier layer.

Referring to FIG. 3 illustrated in cross-sectional drawing is another main embodiment of the current invention, shown 30 (arrow) is the region of silated TaSil or TaSiN, or TiSiN, or WSiN, silicon doped compounds, by the aforementioned plasma treatment and an addition heat treatment thermal annealing process is applied which drives in the silicides into barrier layer 16. Exact thermal annealing conditions to convert barrier natal compounds into robust amorphous diffusion barriers are given in the next figure, FIG. 4.

Figures 4, 5:
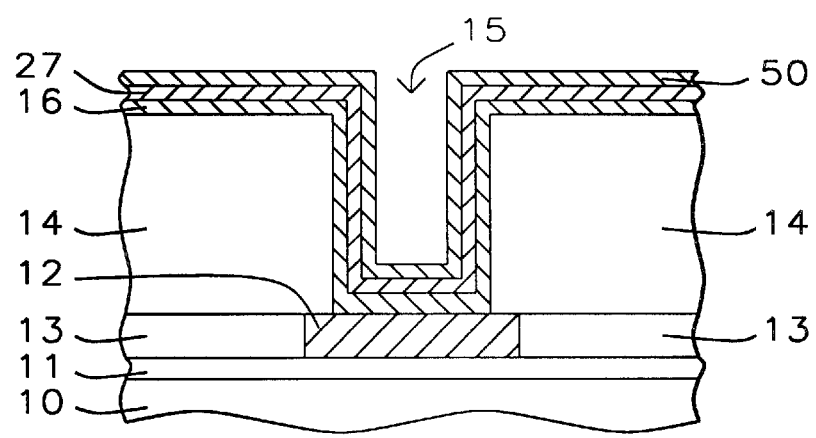
FIG. 4, which shows the temperature treatments necessary to form for high diffusion resistance, rigid barrier layer formation.
FIG. 5, which in cross-sectional representation illustrates another embodiment of the present invention, the copper seed layer with improved adhesion upon the rigid diffusion the barrier layer, for subsequent electrochemical deposition (ECD) of copper to fill the trench cavity.

Referring to FIG. 4, the data presented shows for the current invention the temperatures needed for thermal annealing of barrier material for high resistance to diffusion, for a rigid high density barrier layer formation. In addition, the silated silicon doped compounds exhibit better adhesion properties when combined with chemical vapor deposition (CVD) of copper seed layer. Also, silated silicon doped compound exhibit better resistance to fluorine ion attack, F-, in subsequent processing. Referring to FIG. 4, for example, silated TiN barrier material, TiSiN (40), forms good diffusion barrier material annealing at 600° C. with amorphous structure and similarly, silated TaN barrier material, TaSiN (42), forms good diffusion barrier material annealing at 900° C. with amorphous structure. Amorphous barrier layers prohibit the rapid grain boundary diffusion mechanism since crystal grains and associated grain boundaries are not present. Scanning electron microscope (SEM) analysis of the silated barrier layers reveal highly dense films (>99%) and regions of silicides with low silicon content. Typical annealing process conditions are, for annealing in silane gas, temperatures from about 150 to 450° C.

Referring to FIG. 5, which in cross-sectional representation illustrates another embodiment of the present invention, the chemical vapor deposition (CVD) or physical vapor deposition (PVD) of the copper seed layer (50) upon the barrier layer 16. The copper seed layer (50) exhibits improved adhesion upon the rigid, high density, diffusion barrier layer 16 and silated barrier region 27. The copper seed layer thickness varies and is dependent upon the specific product generation being fabricated. Seed layers need no patterning and are sputtered using argon gas at pressures from about 10 to 70 mTorr. In a subsequent process step, an electrochemical deposition (ECD) of copper is used to fill the trench cavity, upon the copper seed layer.

For completeness and not shown in the figures, is the next processing step in the building of a single or dual damascene structure, namely, the deposition of copper upon the seed layer, by electrochemical copper deposition (ECD). The kinetics of the electrochemical copper deposition process are based on a uniform, defect-free seed layer and barrier layer with good adhesion properties. The underlying layers improve and make wider the process window for the chemical vapor deposition (CVD) of copper to fill both single and dual damascene structures. The copper top conducting layer thickness varies and is dependent upon the specific product generation and product application being fabricated. The electrolyte temperature ranges from about 12 to 25° C. and the copper has a preferred crystal orientation, <111> direction to the substrate surface.

The final processing step in building of the single and dual damascene structure is the chemical mechanical polishing (CMP) back of the excess electrochemical deposited copper metal. The copper is chem-mech polished back without dishing. The copper is polished back so that only the copper that lies in the openings is left to form single and dual inlaid structures that include via and interconnect portions. Device applications include MOSFET and CMOS devices.

While the invention has been particularly shown and described with reference to the preferred embodiments thereof, it will be understood by those skilled in the art that various changes in form and details may be made without departing from the spirit and scope of the invention.

What is claimed is:

1. A method of copper diffusion barrier formation comprising:
   providing a dielectric layer having an opening to copper metal interconnect wiring;
   depositing a diffusion barrier layer over the dielectric layer covering and lining the opening;
   doping with silicon the surface of the diffusion barrier layer by a silane plasma treatment to form silated silicon doped compounds on the surface of the diffusion barrier layer;
   annealing thermally at high temperature the surface of the silicon doped diffusion barrier layer to drive in the silated silicon doped compounds into the diffusion barrier layer and to form a highly dense, amorphous silicon doped diffusion barrier layer.

2. The method of claim 1, further comprising a semiconductor single crystal silicon substrate.

3. The method of claim 1, wherein the dielectric layer is selected from the group consisting of silicon dioxide or silicon oxide.

4. The method of claim 1, wherein the opening is lined with a copper diffusion barrier layer deposited by sputtering physical vapor deposition technique, reactive sputter for nitride, or chemical vapor deposition and the barrier layer material is selected from the group consisting of TaN, Ta, TiN, and WN, with film thickness from 50 to 700 Angstroms.

5. The method of claim 1, wherein the opening is lined with said copper diffusion barrier layer and plasma treated with silane to dope the surface of said diffusion barrier layer with silicon by a plasma process, with power from 300 to 600 Watts and time of about 5 to 240 seconds.

6. The method of claim 1, wherein the copper diffusion barrier layer is thermally annealed at high temperature with silane gas, for the TiSiN silicon doped barrier layer annealing at 600° C. producing an amorphous highly dense film, and for the TaSiN silicon doped barrier layer annealing at 900° C. producing an amorphous highly dense film.

7. The method of claim 1, further comprising the opening is lined with an adhesive copper seed layer on said copper diffusion barrier layer, the copper seed layer deposited by chemical vapor deposition or physical vapor deposition, with the seed layer type material being conducting copper metal in the film thickness range from approximately 50 to 300 Angstroms.

8. The method of claim 1, further comprising a conducting material layers for conducting interconnect lines are formed by electrochemical deposition of copper metal deposited in the opening without seams or voids upon a seed layer and said copper diffusion barrier layer.

9. The method of claim 1, further comprising a level of conducting copper metal is planarized by removing excess conducting material, by a method selected from the group consisting of planarization by chemical mechanical polish, milling, ion milling, and/or etching, leaving only the copper that lies in the opening to form single inlaid structures that include conducting interconnect lines and contact vias.

10. The method of claim 1, further comprising a method whereby multilevel conducting structures are fabricated by repeating the process described herein.

11. A method for fabricating a copper diffusion barrier layer comprising:
   providing a dielectric layer having an opening to copper metal interconnect wiring;
   depositing a diffusion barrier layer over the dielectric layer covering and lining the opening;
   doping with silicon the surface of the diffusion barrier layer by a silane plasma treatment to form silated silicon doped compounds on the surface of the diffusion barrier layer;
   annealing thermally at high temperature the surface of the silicon doped diffusion barrier layer to drive in the silated silicon doped compounds into the diffusion barrier layer and to form a highly dense, amorphous silicon doped diffusion barrier layer;
   depositing a copper seed layer over the silicon doped diffusion barrier layer;
   thus, forming robust defect-free copper diffusion barrier layer and copper seed layer for subsequent electrochemical deposition of plated copper upon the copper seed layer and chem-mech polishing back of excess copper to form inlaid copper interconnects.

12. The method of claim 11, further comprising a semiconductor single crystal silicon substrate.

13. The method of claim 11, wherein the dielectric layer is selected from the group consisting of silicon dioxide or silicon oxide.

14. The method of claim 11, wherein the opening is lined with a copper diffusion barrier layer deposited by sputtering physical vapor deposition technique, reactive sputter for nitride, or chemical vapor deposition and the barrier layer material is selected from the group consisting of TaN, Ta, TiN, and WN, with film thickness from 50 to 700 Angstroms.

15. The method of claim 11, wherein the opening is lined with said copper diffusion barrier layer and plasma treated with silane to dope the surface of said diffusion barrier layer with silicon by a plasma process, with power from 300 to 600 Watts and time of about 5 to 240 seconds.

16. The method of claim 11, wherein the copper diffusion barrier layer is thermally annealed at high temperature with silane gas, for the TiSiN silicon doped barrier layer annealing at 600° C. producing an amorphous highly dense film, and for the TaSiN silicon doped barrier layer annealing at 900° C. producing an amorphous highly dense film.

17. The method of claim 11, further comprising the opening is lined with an adhesive copper seed layer on said copper diffusion barrier layer, the copper seed layer deposited by chemical vapor deposition or physical vapor deposition, with the seed layer type material being conducting copper metal in the film thickness range from approximately 50 to 300 Angstroms.

18. The method of claim 11, further comprising a conducting material layers for conducting interconnect lines are formed by electrochemical deposition of copper metal deposited in the opening without seams or voids upon a seed layer and said copper diffusion barrier layer.

19. The method of claim 11, further comprising a level of conducting copper metal is planarized by removing excess conducting material, by a method selected from the group consisting of planarization by chemical mechanical polish, milling, ion milling, and/or etching, leaving only the copper that lies in the opening to form single inlaid structures that include conducting interconnect lines and contact vias.

20. The method of claim 11, further comprising a method whereby multilevel conducting structures are fabricated by repeating the process described herein.

21. A method for fabricating MOSFET and CMOS devices on a silicon semiconductor substrate with damascene structures using electrochemical deposition of copper and chemical vapor deposition of copper seed layer on a silicon doped diffusion barrier layer comprising:

providing a semiconductor substrate having an insulating layer deposited upon said substrate;

providing a level of copper metal interconnect wiring patterned within an insulating layer over said insulating layer;

providing a dielectric layer having an opening to the copper metal interconnect wiring;

depositing a diffusion barrier layer over the dielectric layer covering and lining the opening, with the diffusion barrier layer material selected from the group consisting of TaN, Ta, TiN and WN;

doping with silicon the surface of the diffusion barrier layer by a silane plasma treatment to form silated silicon doped compounds on the surface of the diffusion barrier layer;

annealing thermally at high temperature the surface of the silicon doped diffusion barrier layer to drive in the silated silicon doped compounds into the diffusion barrier layer and to form a highly dense, amorphous silicon doped diffusion barrier layer;

depositing a copper seed layer over the silicon doped diffusion barrier layer;

depositing by electrochemical deposition copper conducting material over the copper seed layer and removing the excess material layers by chemical mechanical polish to form conducting copper interconnects and contact vias, which are inlaid structures.

22. The method of claim 21, further comprising a semiconductor single crystal silicon substrate.

23. The method of claim 21, wherein the dielectric layer is selected from the group consisting of silicon dioxide or silicon oxide.

24. The method of claim 21, wherein the opening is lined with a copper diffusion barrier layer deposited by sputtering physical vapor deposition technique, reactive sputter for nitride, or chemical vapor deposition and the barrier layer material is selected from the group consisting of TaN, Ta, TiN, and WN, with film thickness from 50 to 700 Angstroms.

25. The method of claim 21, wherein the opening is lined with said copper diffusion barrier layer and plasma treated with silane to dope the surface of said diffusion barrier layer with silicon by a plasma process, with power from 300 to 600 Watts and time of about 5 to 240 seconds.

26. The method of claim 21, wherein the copper diffusion barrier layer is thermally annealed at high temperature with silane gas, for the TiSiN silicon doped barrier layer annealing at 600° C. producing an amorphous highly dense film, and for the TaSiN silicon doped barrier layer annealing at 900° C. producing an amorphous highly dense film.

27. The method of claim 21, further comprising the opening is lined with an adhesive copper seed layer on said copper diffusion barrier layer, the copper seed layer deposited by chemical vapor deposition or physical vapor deposition, with the seed layer type material being conducting copper metal in the film thickness range from approximately 50 to 300 Angstroms.

28. The method of claim 21, further comprising a conducting material layers for conducting interconnect lines are formed by electrochemical deposition of copper metal deposited in the opening without seams or voids upon a seed layer and said copper diffusion barrier layer.

29. The method of claim 21, further comprising a level of conducting copper metal is planarized by removing excess conducting material, by a method selected from the group consisting of planarization by chemical mechanical polish, milling, ion milling, and/or etching, leaving only the copper that lies in the opening to form single inlaid structures that include conducting interconnect lines and contact vias.

30. The method of claim 21, further comprising a method whereby multilevel conducting structures are fabricated by repeating the process described herein.

* * * * *